(12) United States Patent
Won et al.

(10) Patent No.: US 9,575,136 B2
(45) Date of Patent: Feb. 21, 2017

(54) APPARATUS AND METHOD FOR MEASURING IMPEDANCE OF FUEL CELL STACK

(71) Applicant: HYUNDAI MOTOR COMPANY, Seoul (KR)

(72) Inventors: Sang Bok Won, Seoul (KR); Kwi Seong Jeong, Yongin-si (KR)

(73) Assignee: HYUNDAI MOTOR COMPANY, Seoul (KR)

( * ) Notice: Subject to any disclaimer, the term of this patent is extended or adjusted under 35 U.S.C. 154(b) by 161 days.

(21) Appl. No.: 14/562,263

(22) Filed: Dec. 5, 2014

(65) Prior Publication Data
US 2016/0084915 A1   Mar. 24, 2016

(30) Foreign Application Priority Data

Sep. 18, 2014  (KR) ........................ 10-2014-0124553

(51) Int. Cl.
*G01N 27/416* (2006.01)
*G01R 31/36* (2006.01)

(52) U.S. Cl.
CPC ................................. *G01R 31/3662* (2013.01)

(58) Field of Classification Search
CPC .................................................. G01R 31/3658
USPC ........................................................ 324/430
See application file for complete search history.

(56) References Cited

U.S. PATENT DOCUMENTS

| 6,376,111 | B1* | 4/2002 | Mathias | H01M 8/04126 |
|---|---|---|---|---|
| | | | | 429/413 |
| 2005/0048336 | A1 | 3/2005 | Takebe et al. | |
| 2007/0264551 | A1* | 11/2007 | Matsunaga | H01M 4/8605 |
| | | | | 429/483 |
| 2009/0162710 | A1 | 6/2009 | Kajiwara | |
| 2010/0013490 | A1* | 1/2010 | Manabe | H01M 8/04649 |
| | | | | 324/430 |

FOREIGN PATENT DOCUMENTS

| JP | 2007-250365 A | 9/2007 |
|---|---|---|
| JP | 2011-047666 A | 3/2011 |
| JP | 2011-233242 A | 11/2011 |
| JP | 2013-145692 A | 7/2013 |
| JP | 2013-191362 A | 9/2013 |
| KR | 10-2004-0072249 A | 8/2004 |
| KR | 10-2005-0012151 A | 1/2005 |
| KR | 10-1083370 B1 | 11/2011 |

\* cited by examiner

*Primary Examiner* — Arun Williams
(74) *Attorney, Agent, or Firm* — McDermott Will & Emery LLP

(57) ABSTRACT

An apparatus and method for measuring impedance of a fuel cell stack capable of accurately measuring the impedance even when a DC current of the fuel cell stack is changed depending on fluctuation of a load, by compensating for an AC voltage (or AC current) used to measure the impedance of the fuel cell stack based on a DC current of the fuel cell stack.

6 Claims, 3 Drawing Sheets

APPARATUS AND METHOD FOR MEASURING IMPEDANCE OF FUEL CELL STACK

CROSS-REFERENCE TO RELATED APPLICATION

This application is based on and claims the benefit of priority to Korean Patent Application No. 10-2014-0124553, filed on Sep. 18, 2014 in the Korean Intellectual Property Office, the disclosure of which is incorporated herein in its entirety by reference.

TECHNICAL FIELD

The present disclosure relates to an apparatus and a method for measuring impedance of a fuel cell stack, and more particularly, to a technology of accurately measuring impedance of a fuel cell stack even when an output (direct current (DC)) of a fuel cell stack fluctuates based on load.

BACKGROUND

A fuel cell is a kind of power generation device which converts chemical energy. In fuel into electrical energy by an electrochemical reaction within a fuel cell stack without converting the chemical energy to heat by combustion. This type of power generation device may be used not only to supply power for an industry, a household, and vehicle driving but also to supply power to small electric/electronic products, in particular, portable devices.

Currently, as a power supply source for driving a vehicle, polymer electrolyte membrane fuel cells (PEMFC) and proton exchange membrane fuel cells (PEMFC) having the highest power density among the fuel cells have been most researched, because these cell types have a rapid starting time and a rapid power conversion reaction time due to a low operating temperature.

The polymer electrolyte membrane fuel cell is configured to include a membrane electrode assembly (MEA) in which catalytic electrode layers where the electrochemical reaction is generated are attached to both sides of a solid polymer electrolyte membrane in which protons move, a gas diffusion layer (GDL) which serves to uniformly distribute reaction gases and transfer generated electrical energy, a gasket and a fastener which maintain air tightness and proper fastening pressure of the reaction gases and cooling water, and a bipolar plate which moves the reaction gases and the cooling water.

In assembling the fuel cell stack using such unit cell components, a combination of the membrane electrode assembly and the gas diffusion layer which are main components is positioned at the innermost portion of the cell. Here, the membrane electrode assembly is provided with the catalytic electrode layers, i.e., an anode and a cathode which are applied with a catalyst to provide a reaction of hydrogen and oxygen at both surfaces of the polymer electrolyte membrane, and an outer portion where the anode and the cathode are positioned is stacked with the gas diffusion layer, a gasket, and the like.

An outer portion of the gas diffusion layer is supplied with reaction gas (hydrogen which is fuel and oxygen or air which is an oxidizer) and is provided with a bipolar plate formed with a flow field through which cooling water passes.

A plurality of unit cells are stacked by setting the configuration as a unit cell, and then the outermost portion thereof is coupled with a current collector, an insulating plate, and an end plate for supporting the stacked cells. The unit cells between the end plates are repeatedly stacked and fastened, thereby configuring the fuel cell stack.

To obtain necessary potential in a vehicle, the unit cells need to be stacked as much as necessary. Since potential generated from one unit cell is about 1.3 V, a plurality of cells are stacked in series to produce power required to drive a vehicle.

In a fuel cell vehicle, the impedance of the fuel cell stack is used to measure an AC voltage of the stack.

The typical apparatus for measuring impedance of a fuel cell stack applies an alternating current (AC) (e.g., sinewave) to a fuel cell stack and then measures an AC voltage of the fuel cell stack and uses the measured AC voltage and AC to measure the impedance of the fuel cell stack.

The typical apparatus for measuring impedance of the fuel cell stack measures the impedance of a fuel cell stack while ignoring the fact that the impedance of the fuel cell stack changes when the DC current of the fuel cell stack chances depending on fluctuation of a load.

SUMMARY

The present disclosure has been made to solve the above-mentioned problems occurring in the prior art while advantages achieved by the prior art are maintained intact.

An aspect of the present disclosure provides an apparatus and a method for measuring impedance of a fuel cell stack capable of accurately measuring the impedance even when a DC current of the fuel cell stack changes depending on load fluctuation, by compensating for an AC voltage (or AC current) used to measure the impedance of the fuel cell stack based on the DC current of the fuel cell stack.

The foregoing and other objects, features, aspects and advantages of the present disclosure will be understood and become more apparent from the following detailed description of the present disclosure. Also, it can be easily understood that the objects and advantages of the present disclosure can be realized by the units and combinations thereof recited in the claims.

According to an exemplary embodiment of the present disclosure, an apparatus for measuring impedance of a fuel cell stack includes an AC current applier configured to apply AC current to a fuel cell stack; an AC voltage measurer configured to measure an AC voltage of the fuel cell stack; a DC current measurer configured to measure a DC current of the fuel cell stack; an AC voltage compensator configured to compensate for an AC voltage measured by the AC voltage measurer based on the DC current measured by the DC current measurer; and an impedance measurer configured to measure the impedance of the fuel cell stack based on the AC voltage compensated by the AC voltage compensator and the AC current applied by the AC current applier.

According to another exemplary embodiment of the present disclosure, a method for measuring impedance of a fuel cell stack includes applying, by an AC current applier, AC current to a fuel cell stack; measuring, by an AC voltage measurer, an AC voltage of the fuel cell stack; measuring, by a DC current measurer, a DC current of the fuel cell stack; compensating for, by an AC voltage compensator, the measured AC voltage based on the measured DC current; and measuring, by an impedance measurer, the impedance of the fuel cell stack based on the compensated AC voltage and the applied AC current.

BRIEF DESCRIPTION OF THE DRAWINGS

The above and other objects, features and advantages of the present disclosure will be more apparent from the following detailed description taken in conjunction with the accompanying drawings.

DETAILED DESCRIPTION

The foregoing objects, features and advantages will become more apparent from the following description of exemplary embodiments of the present disclosure with reference to accompanying drawings, which are set forth hereinafter. Accordingly, those having ordinary knowledge in the related art to which the present disclosure pertains will easily embody technical ideas or spirit of the present disclosure. Further, when technical configurations known in the related art are considered to make the contents obscure in the present disclosure, the detailed description thereof will be omitted. Hereinafter, exemplary embodiments of the present disclosure will be described in detail with reference to the accompanying drawings.

Figure 1:
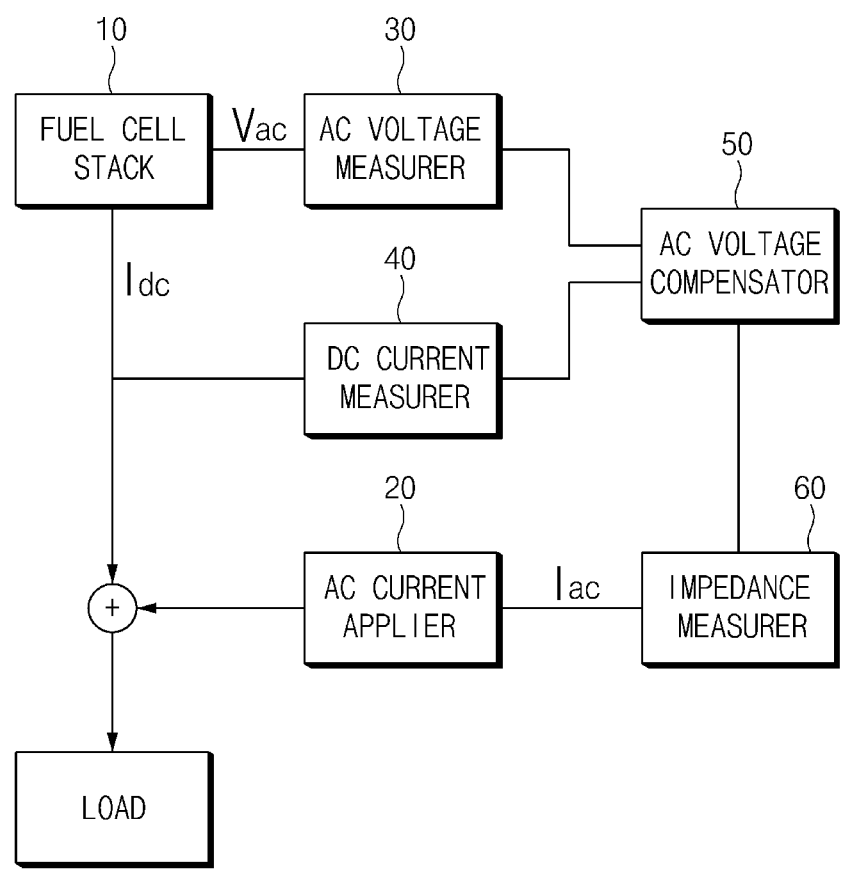
FIG. 1 is a configuration diagram of an apparatus for measuring impedance of a fuel cell stack according to an exemplary embodiment of the present disclosure.

FIG. 1 is a configuration diagram of an apparatus for measuring impedance of a fuel cell stack according to an exemplary embodiment of the present disclosure.

As illustrated in FIG. 1, an apparatus for measuring impedance of a fuel cell stack according to an exemplary embodiment of the present disclosure includes a fuel cell stack 10, an AC current applier 20, an AC voltage measurer 30, a DC current measurer 40, an AC voltage compensator 50, and an impedance measurer 60.

Describing each component, first, the fuel cell stack 10 supplies power to a load. In this case, a power supply is used as a power source for driving a vehicle.

The AC current applier 20 applies AC current ($I_{ac}$) to the fuel cell stack 10 so that an AC voltage component appears in an output voltage of the fuel cell stack 10. That is, when the AC current is applied to the fuel cell stack 10, the AC voltage component appears in the output voltage of the fuel cell stack.

The AC voltage measurer 30 measures the AC voltage ($V_{ac}$) of the fuel cell stack.

The DC current measurer 40 measures the DC current ($I_{dc}$) of the fuel cell stack.

The AC voltage compensator 50 compensates for the AC voltage measured by the AC voltage measurer 30 based on the DC current measured by the DC current measurer 40.

That is, the AC voltage compensator 50 compensates for the AC voltage measured by the AC voltage measurer 30 using the following Equation 1.

$$V_{ac\_c} = \frac{V_{ac}}{I_{dc}} \times C \quad \text{[Equation 1]}$$

In the above Equation 1, V, represents a compensated AC voltage, $V_{ac}$ represents a non-compensated AC voltage, $I_{dc}$ represents the DC current of the fuel cell stack, and C represents a compensation rate adjusting constant.

The impedance measurer 60 measures the impedance of the fuel cell stack based on the AC voltage compensated by the AC voltage compensator 50 and the AC current applied by the AC current applier 20. Here, technology for measuring impedance is well known and therefore a detailed description thereof will be omitted.

According to the exemplary embodiment of the present disclosure, the AC voltage measurer 30, and the DC current measurer 40 may be implemented as a sensor and functions of the AC voltage compensator 50 and the impedance measurer 60 may be performed by a controller (not illustrated).

In addition, the DC current may also be compensated by a battery. That is, when the fluctuation of the load occurs, the battery performs compensation to maintain the DC current constant at all times.

Further, any measurement value obtained when the load fluctuates is deleted, and then impedance may be measured.

Figure 2:
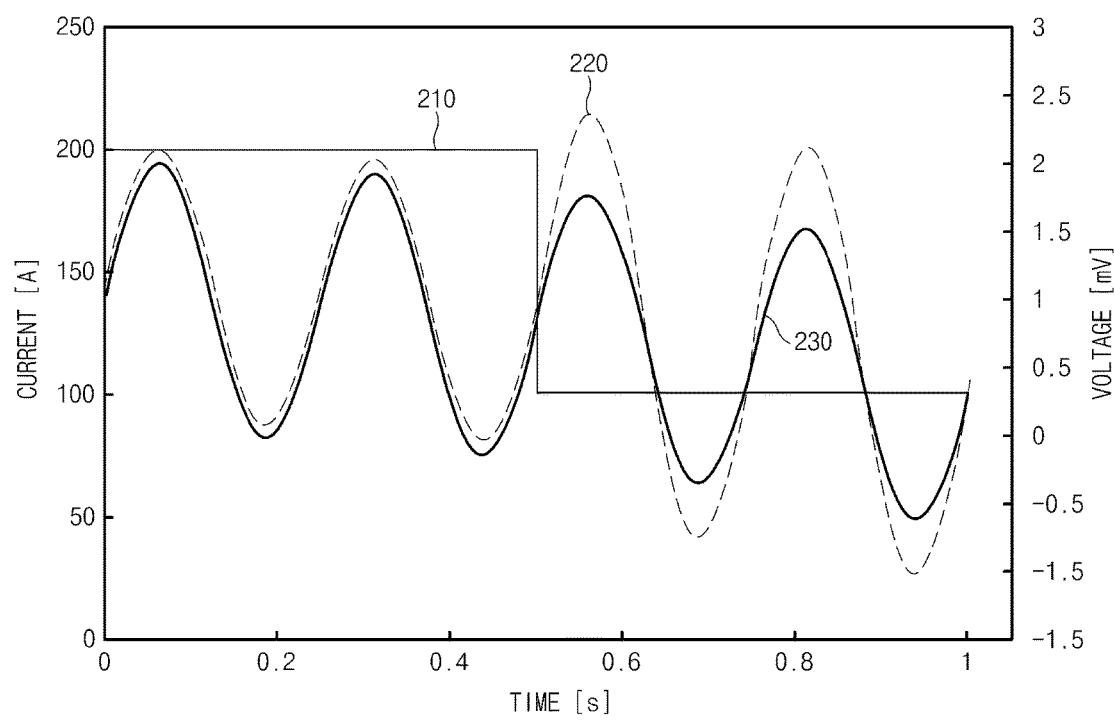
FIG. 2 is one exemplified diagram of an AC voltage of a fuel cell stack which is compensated by an AC compensator according to an exemplary embodiment of the present disclosure.

FIG. 2 is one exemplified diagram of an AC voltage of a fuel cell stack which is compensated by an AC compensator according to an exemplary embodiment of the present disclosure.

In FIG. 2, reference numeral 210 represents the DC current of the fuel cell stack 10, reference numeral 220 represents the non-compensated AC voltage of the fuel cell stack 10, and reference numeral 230 represents the compensated AC voltage of the fuel cell stack 10.

It may be appreciated from FIG. 2 that when the DC current 210 of the fuel cell stack 10 changes, amplitude of the non-compensated AC voltage 220 of the fuel cell stack 10 also changes.

However, even when the DC current of the fuel cell stack 10 is changed, amplitude of the compensated AC voltage 230 of the fuel cell stack 10 may be constant. Therefore, it is possible to perform the accurate impedance measurement.

Figure 3:
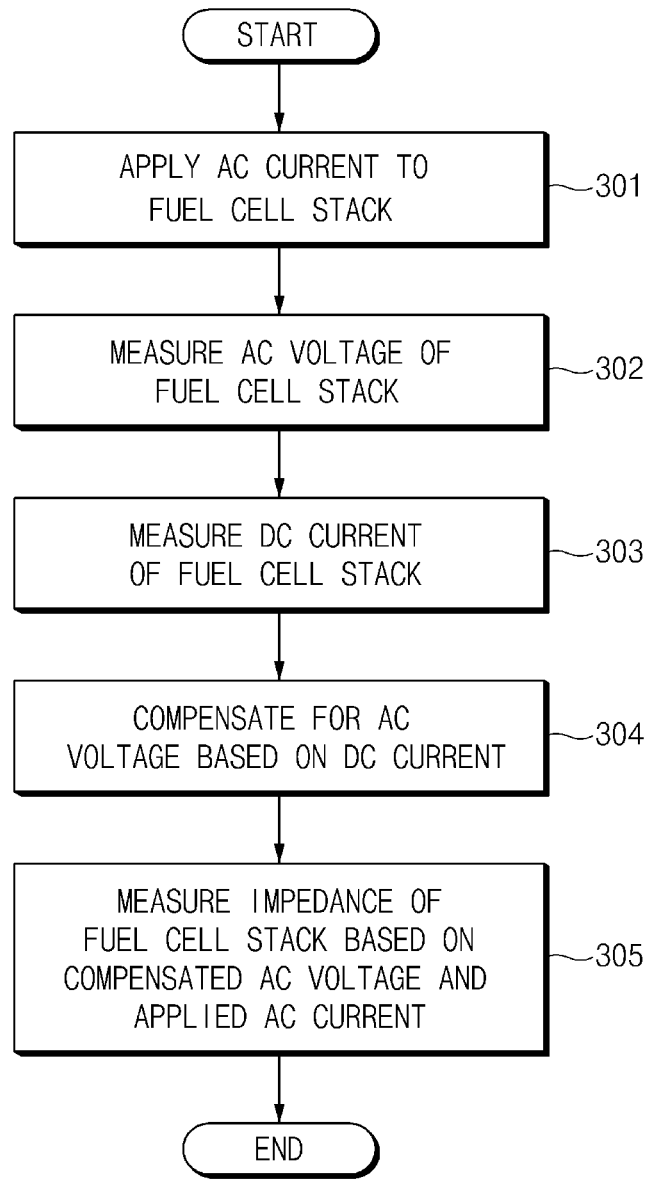
FIG. 3 is a flow chart of a method for measuring impedance of a fuel cell stack according to an exemplary embodiment of the present disclosure.

FIG. 3 is a flow chart of a method for measuring impedance of a fuel cell stack according to an exemplary embodiment of the present disclosure.

First, the AC current applier 20 applies AC current to the fuel cell stack 10 (301).

Next, the AC voltage measurer 30 measures the AC voltage of the fuel cell stack 10 (302).

Further, the DC current measurer 40 measures the DC current of the fuel cell stack 10 (303).

Next, the AC voltage compensator 50 compensates for the AC voltage measured by the AC voltage measurer 30 based on the DC current measured by the DC current measurer 40 (304).

Next, the impedance measurer 60 measures the impedance of the fuel cell stack 10 based on the AC voltage compensated by the AC voltage compensator 50 and the AC current applied by the AC current applier 20 (305).

The method according to the exemplary embodiment of the present disclosure as described above may be implemented by a computer program. A code and a code segment configuring the program may be easily inferred by a computer programmer in the art. Further, the prepared program may be stored in a computer-readable recording medium (information storage medium), read and run by the computer. The recording medium may include all the types of recording media which may be read by the computer.

As described above, according to the exemplary embodiments of the present disclosure, it is possible to accurately measure the impedance even when the DC current of the fuel cell stack changes depending on fluctuation of the load, by compensating for the AC voltage used to measure the impedance of the fuel cell stack based on the DC current of the fuel cell stack.

The present invention described above may be variously substituted, altered, and modified by those skilled in the art to which the present invention pertains without departing from the scope and sprit of the present invention. Therefore, the present invention is not limited to the above-mentioned exemplary embodiments and the accompanying drawings.

What is claimed is:

1. An apparatus for measuring impedance of a fuel cell stack, comprising:
    an AC current applier configured to apply AC current to a fuel cell stack;
    an AC voltage measurer configured to measure an AC voltage of the fuel cell stack;
    a DC current measurer configured to measure a DC current of the fuel cell stack;
    an AC voltage compensator configured to compensate for the AC voltage measured by the AC voltage measurer based on the DC current measured by the DC current measurer; and
    an impedance measurer configured to measure impedance of the fuel cell stack based on the AC voltage compensated by the AC voltage compensator and the AC current applied by the AC current applier.

2. The apparatus according to claim 1, wherein the AC voltage compensator compensates for the AC voltage measured by the AC voltage measurer based on the following Equation:

$$V_{ac\_c} = \frac{V_{ac}}{I_{dc}} \times C$$

wherein $V_{ac\_c}$ represents the compensated AC voltage, $V_{ac}$ represents a non-compensated AC voltage, $I_{dc}$ represents the DC current of the fuel cell stack, and C represents a compensation rate adjusting constant.

3. The apparatus according to claim 1, wherein the AC voltage compensator compensates for the AC voltage to make the amplitude of the AC voltage of the fuel cell stack constant even when the DC current of the fuel cell stack is changed.

4. A method for measuring impedance of a fuel cell stack, comprising:
    applying, by an AC current applier, AC current to a fuel cell stack;
    measuring, by an AC voltage measurer, an AC voltage of the fuel cell stack;
    measuring, by a DC current measurer, a DC current of the fuel cell stack;
    compensating for, by an AC voltage compensator, the measured AC voltage based on the measured DC current; and
    measuring, by an impedance measurer, the impedance of the fuel cell stack based on the compensated AC voltage and the applied AC current.

5. The method according to claim 4, wherein in the compensating for the AC voltage, the AC voltage measured by the AC voltage measurer is compensated using the following Equation:

$$V_{ac\_c} = \frac{V_{ac}}{I_{dc}} \times C$$

wherein $V_{ac\_c}$ represents the compensated AC voltage, $V_{ac}$ represents a non-compensated AC voltage, $I_{dc}$ represents the DC current of the fuel cell stack, and C represents a compensation rate adjusting constant.

6. The method according to claim 4, wherein the compensating for the AC voltage includes compensation to cause the amplitude of the AC voltage of the fuel cell stack to remain constant even when the DC current of the fuel cell stack changes.

* * * * *